(12) United States Patent
Chen et al.

(10) Patent No.: US 9,035,329 B2
(45) Date of Patent: May 19, 2015

(54) LIGHT-EMITTING DEVICE

(75) Inventors: Chao-Hsing Chen, Hsinchu (TW);
Chien-Kai Chung, Hsinchu (TW);
Hui-chen Yeh, Hsinchu (TW); Yi-Wen Ku, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 269 days.

(21) Appl. No.: 13/048,357

(22) Filed: Mar. 15, 2011

(65) Prior Publication Data
US 2012/0061691 A1  Mar. 15, 2012

Related U.S. Application Data

(60) Provisional application No. 61/382,466, filed on Sep. 13, 2010.

(51) Int. Cl.
*H01L 33/00* (2010.01)
*H01L 25/075* (2006.01)
*H01L 27/15* (2006.01)
*H01L 33/38* (2010.01)
*H01L 33/62* (2010.01)

(52) U.S. Cl.
CPC .......... *H01L 25/0753* (2013.01); *H01L 27/156* (2013.01); *H01L 33/385* (2013.01); *H01L 33/62* (2013.01); *H01L 2224/24* (2013.01)

(58) Field of Classification Search
CPC ... H01L 27/3204; H01L 33/00; H01L 25/048; H01L 2021/60; H01L 2224/02; H01L 25/0753; H01L 27/156; H01L 33/385; H01L 33/62; H01L 2224/24; F21Y 2101/02; F21Y 2103/003; F21Y 2113/00
USPC .......... 362/236, 240, 227; 315/307, 308, 200, 315/291, 298, 306, 312; 257/79, 88, 99, 257/E33.066
See application file for complete search history.

(56) References Cited

U.S. PATENT DOCUMENTS

| | | | |
|---|---|---|---|
| 6,998,642 B2* | 2/2006 | Lin et al. ................... | 257/79 |
| 7,525,248 B1* | 4/2009 | Fan ........................... | 313/512 |
| 7,564,198 B2* | 7/2009 | Yamamoto et al. ........ | 315/307 |
| 7,897,981 B2* | 3/2011 | Lee .......................... | 257/88 |
| 2006/0098438 A1* | 5/2006 | Ouderkirk et al. ........ | 362/294 |
| 2006/0163589 A1* | 7/2006 | Fan et al. .................. | 257/88 |
| 2008/0211416 A1* | 9/2008 | Negley et al. ............. | 315/193 |
| 2010/0072494 A1* | 3/2010 | Lee et al. .................. | 257/88 |

* cited by examiner

*Primary Examiner* — Galina Yushina
(74) *Attorney, Agent, or Firm* — Muncy, Geissler, Olds & Lowe, P.C.

(57) ABSTRACT

The light-emitting device having an equivalent circuit, includes at least four terminals, numbered from first terminal to fourth terminal, for electrical power feeding; a first light-emitting diode, arranged between the first terminal and the second terminal, configured to not emit light when a voltage is applied between the second terminal and one of the third terminal and the fourth terminal, and configured to emit light when a. voltage is applied between the first terminal and one of the third terminal and the four the terminal; and a second light-emitting diode, arranged between the third terminal and the fourth terminal, and configured to not emit light when the voltage is applied between the third terminal and one of the first terminal and the second terminal and configured to emit light when a voltage is applied between the fourth terminal and one of the first terminal and the second terminal.

20 Claims, 5 Drawing Sheets

LIGHT-EMITTING DEVICE

This application claims the benefit of provisional application No. 61/382,466 filed on Sep. 13, 2010; the contents of which are incorporated herein by reference in their entirety.

BACKGROUND

1. Technical Field

The present disclosure relates to a light-emitting device, and in particular to a light-emitting device with an adjustable operating voltage.

2. Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in household appliances, indicator light of instruments, and opto-electrical products, etc. As the opto-electrical technology evolves, the solid-state lighting elements have great progress in the light efficiency, operation life and the brightness, and LEDs are expected to become the main stream of the lighting devices in the near future.

Generally speaking, a light-emitting array comprising a plurality of light-emitting diodes electrically connected with each other are designed to have a predetermined operating voltage at a predetermined current for emitting light. However, during fabrication of the light-emitting diodes, the actual operating voltage of the light-emitting diodes may be deviated from the predetermined operating voltage.

SUMMARY OF THE DISCLOSURE

The present disclosure provides a light-emitting device. The light-emitting device having an equivalent circuit, includes at least four terminals, numbered from first terminal to fourth terminal, for electrical power feeling; a first light-emitting diode, arranged between the first terminal and the second terminal, configured to not emit light when a voltage is applied between the second terminal and one of the third terminal and the fourth terminal, and configured to emit light when a voltage is applied between the first terminal and one of the third terminal and the four the terminal; and a second light-emitting diode, electrically connected to the first light-emitting diode in series, arranged between the third terminal and the fourth terminal, and configured to not emit light when the voltage is applied between the third terminal and one of the first terminal and the second terminal and configured to emit light when a voltage is applied between the fourth terminal and one of the first terminal and the second terminal.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
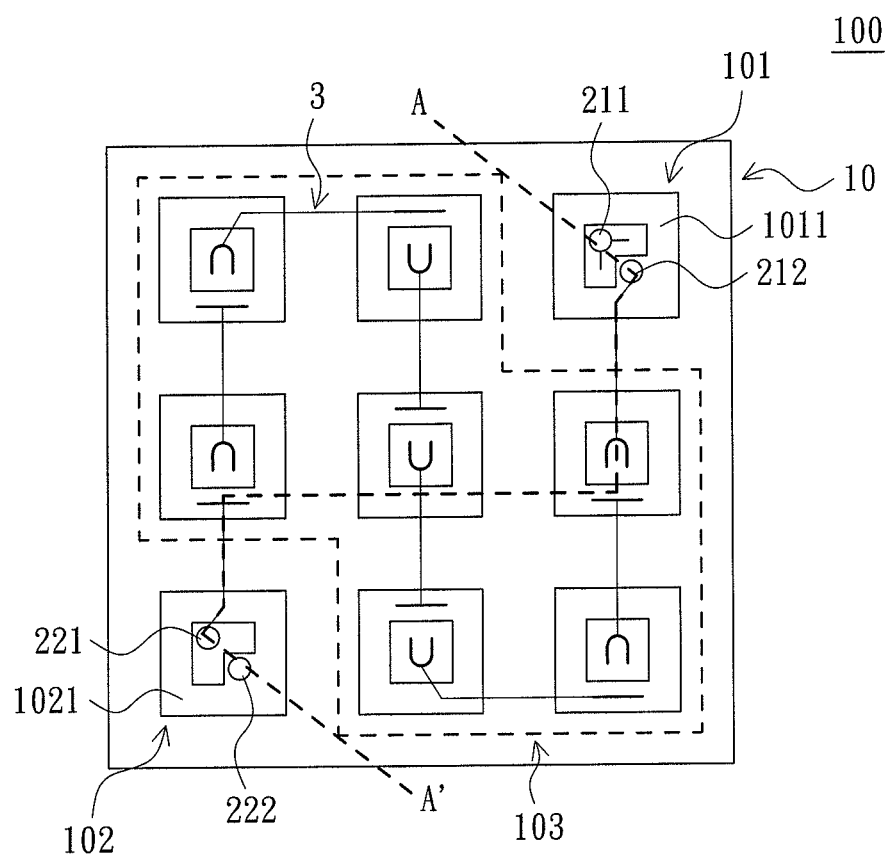
FIG. 1 shows a planar view of a light-emitting device in accordance with the first embodiment of the present disclosure.

FIG. 1 discloses a light-emitting device 100 according to the first embodiment of the present disclosure. The light-emitting device 100 comprises a light-emitting array 10 comprising a first light-emitting unit 101, a second light-emitting unit 102 and a third light-emitting unit 103. The first, second and third light-emitting units 101, 102 103 are electrically connected in series with each other through an electrical connection structure 3. The third light-emitting unit 103 is arranged between the first and second light-emitting units 101, 102. The first, second, and third light-emitting units 101, 102, 103 are formed on a single substrate or its own substrate by epitaxial growth and/or bonding method. Provided the light-emitting structures are formed on their respective substrates, those substrates can be further integrated together with each other. The bonding method includes but not limited to metal bonding, eutectic bonding, glue bonding, and fusion bonding. In this embodiment, the light-emitting array 10 has two ends for receiving a signal from a power supply which can provides an alternating current or a direct current. The first light-emitting unit 101 comprises a first light-emitting diode 1011 positioned on one end of the light-emitting array 10, and the second light-emitting unit 102 comprises a second light-emitting diode 1021 positioned on the other end of the light-emitting array 10 for receiving the signal to emit light. For example, the two ends of the light-emitting array 10 are arranged on two opposite sides or two diagonally opposite corners of the light-emitting device 100, as shown in FIG. 1.

Figure 2A:
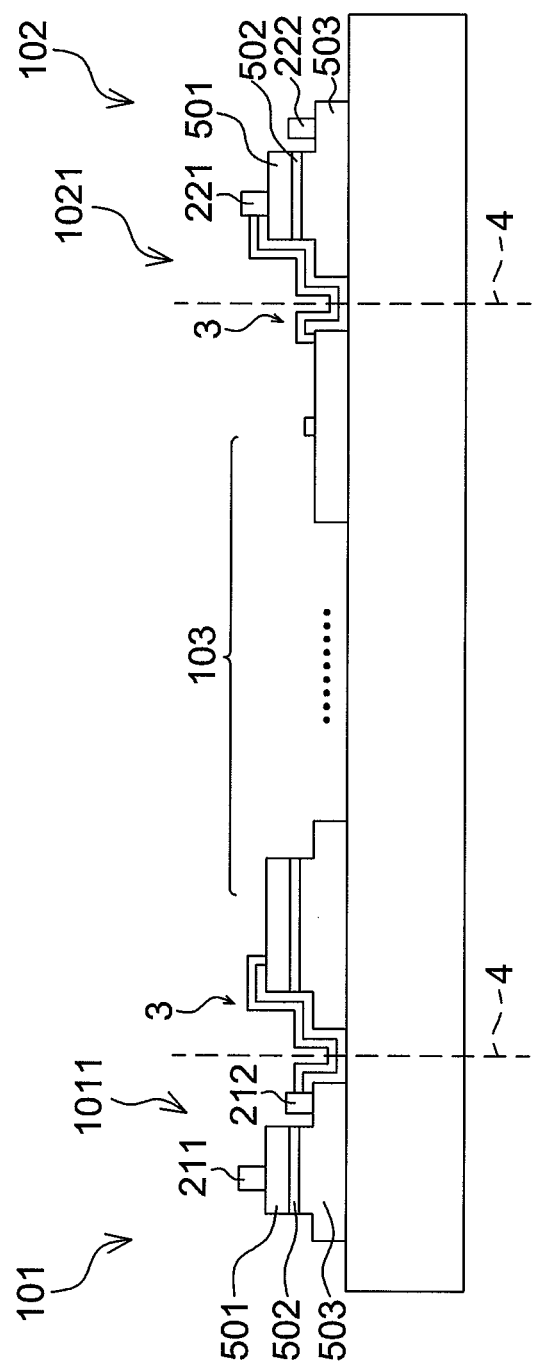
FIG. 2A shows a cross-sectional view of the light-emitting device, taken along line AA' of FIG. 1.

FIG. 2A shows a cross-sectional structure across the cross-section line AA' of FIG. 1. Referring to FIGS. 1 and 2A, each of the first and second light-emitting diodes 1011, 1021 has a first semiconductor layer 501, a second semiconductor layer 503, and an active layer 502 sandwiched between the first and second semiconductor layers 501, 503. The light-emitting device 100 further comprises two first bonding pads 211, 212 respectively formed on the first and second semiconductor layers 501, 503 of the first light-emitting diode 1011, and two second bonding pads 221, 222 respectively formed on the first and second semiconductor layers 501, 503 of the second light-emitting diode 1021. The first, second and third light-emitting unit 101, 102 103 are separated by a trench 4. The electrical connection structure 3 connects the first light-emitting diode 1011 to the third light-emitting unit 103, and further to the second light-emitting diode 1021. In one embodiment, the third light-emitting unit 103 can comprise a plurality of light-emitting diodes coupled in series connection, parallel connection, or a combination thereof.

In operation, one of the two first bonding pads 211, 212 is in a floating level, and one of the two second bonding pads 221, 222 is in a floating level, that is, only one of the two first bonding pads 211, 212 and only one of the two second bonding pads 221, 222 are electrically connected to the power supply (not shown). In this embodiment, the operating voltage at a predetermined current (or resistance) of the light-emitting array 10 is varied through the two first and second bonding pads 211, 212, 221, 222. Assuming the operating voltage (or resistance) of the first light-emitting unit 101 at a predetermined current is $V_1$ (or $R_1$); the operating voltage (or resistance) of the second light-emitting unit 102 at the predetermined current is $V_2$ (or $R_2$); the operating voltage (or resistance) of the third light-emitting unit 103 at the predetermined current is $V_3$ (or $R_3$). For example, when the first bonding pad 211 and the second bonding pad 222 are electrically connected to the power supply or other circuit or network, the operating voltage (or resistance) of the light-emitting array 10 at the predetermined current is $V_1+V_2+V_3$ (or $R_1+R_2+R_3$). When the first bonding pad 211 and the second bonding pad 221 are electrically connected to the power supply, the operating voltage (or resistance) of the light-emitting array 10 at the predetermined current is $V_1+V_3$ (or $R_1+R_3$). When the first bonding pad 212 and the second bonding pad 222 are electrically connected to the power supply, the operating voltage (or resistance) of the light-emitting array 10 at the predetermined current is $V_2+V_3$ (or $R_2+R_3$). When the first bonding pad 212 and the second bonding pad 221 are electrically connected to the power supply, the operating voltage (or resistance) of the light-emitting array 10 at the predetermined current is $V_3$ (or $R_3$). In this embodiment, the operating voltage (or resistance) of the light-emitting array 10 at a predetermined current can be adjusted in four levels or three levels (if $V_1=V_2$ or $R_1=R_2$). In one embodiment, the number of the first and second bonding pads 211, 212, 221, 222 can be more than two, depending on the actual requirements. Therefore, the operating voltage (or resistance) of the light-emitting array 10 at a predetermined current can be adjusted in various levels.

Figure 2B:
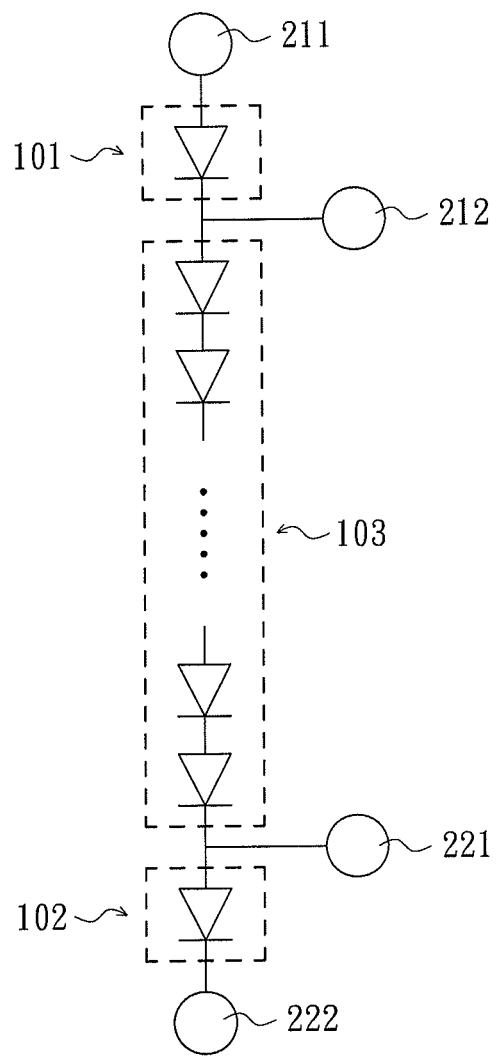
FIG. 2B is a circuit diagram of the light-emitting device in accordance with the first embodiment of the present disclosure.

It is noted that because of the arrangement of the multiple bonding pads in the present embodiment, the operating voltage of the light-emitting array at a predetermined current can be adjusted by selectively adopting the bonding pads to approach the desired voltage even a deviation of the operating voltage of the light-emitting units occur. A difference between two of the three or four levels of the operating voltage of the light-emitting array 10 ranges from 1V to 10V. The equivalent circuit of FIG. 1 is illustrated in FIG. 2B.

Figure 3:
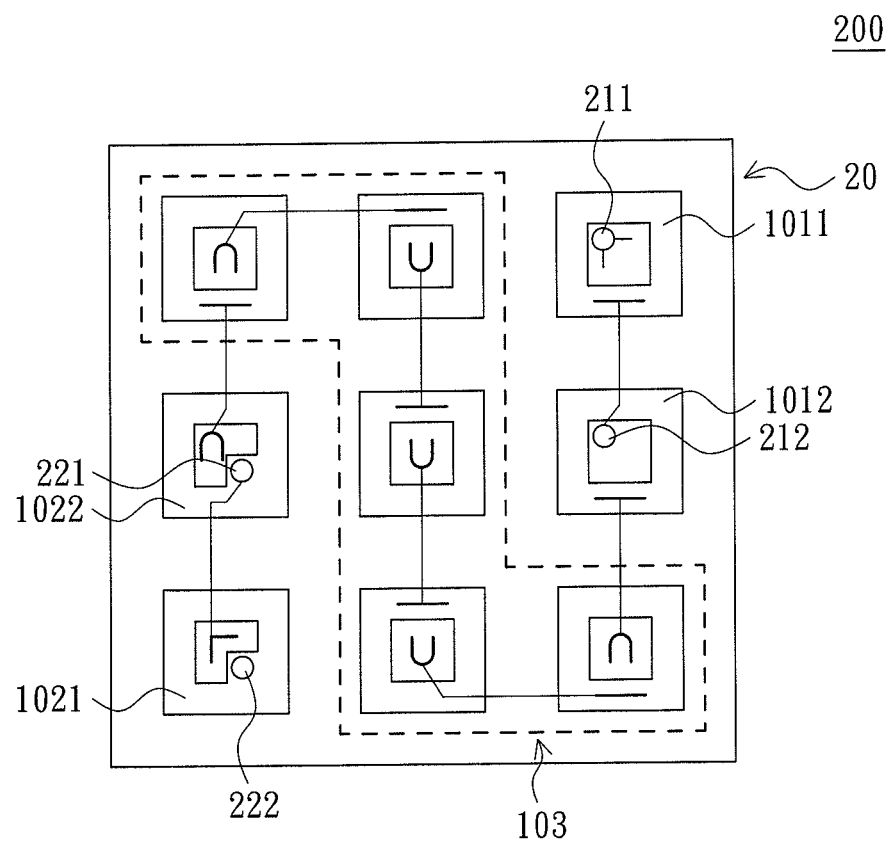
FIG. 3 is a planar view of a light-emitting device in accordance with the second embodiment of the present disclosure.
Figure 4:
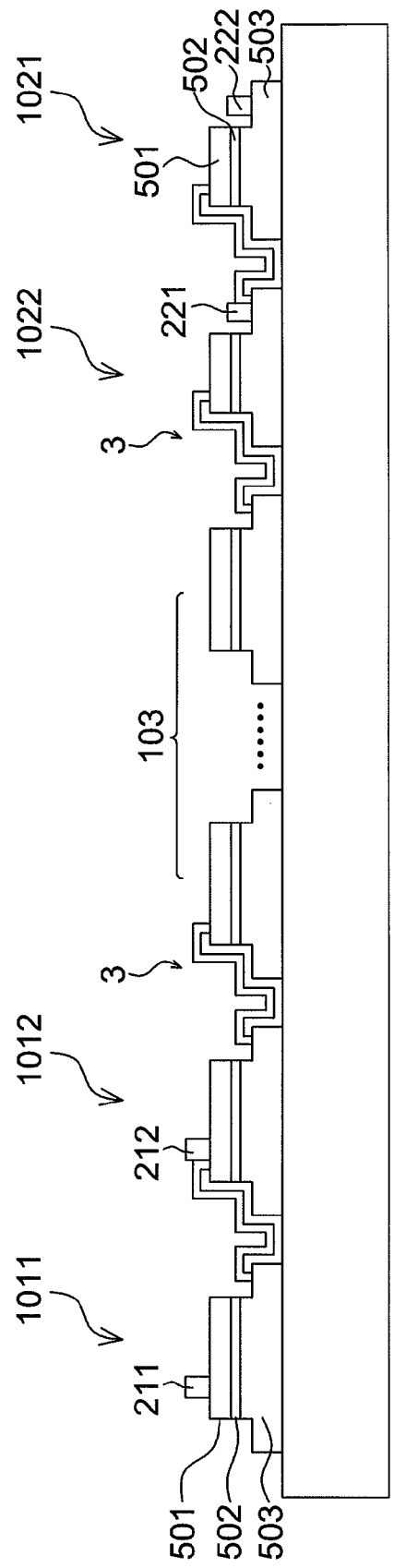
FIG. 4 is a cross-sectional view of the light-emitting device in accordance with the second embodiment of the present disclosure.

FIGS. 3 and 4 disclose a light-emitting device 200 according to the second embodiment of the present disclosure. The second embodiment of the light-emitting device 200 has the similar structure with the first embodiment of the light-emitting device 100. The first light-emitting unit 101 further comprises a third light-emitting diode 1012 adjacent to the first light-emitting diode 1011, and the second light-emitting unit 102 further comprises a fourth light-emitting diode 1022 adjacent to the second light-emitting diode 1022. Each of the third and fourth light-emitting diodes comprises a first semiconductor layer 501, a second semiconductor layer 503, and an active layer 502 sandwiched between the first and second semiconductor layers 501, 503. The first bonding pad 212 is formed on the first semiconductor layer 501 of the third light-emitting diodes 1012. The second bonding pad 221 is formed on the second semiconductor layer 503 of the fourth light-emitting diode 1022. Likewise, when the first bonding pad 211 and the second bonding pad 222 are electrically connected to the power supply, the operating voltage of the light-emitting array 10 at the predetermined current is $V_1+V_2+V_3$. When the first bonding pad 211 and the second bonding pad 221 are electrically connected to the power supply, the operating voltage of the light-emitting array 10 at the predetermined current is $V_1+V_3$. When the first bonding pad 212 and the second bonding pad 222 are electrically connected to the power supply, the operating voltage of the light-emitting array 10 at the predetermined current is $V_2+V_3$. When the first bonding pad 212 and the second bonding pad 221 are electrically connected to the power supply, the operating voltage of the light-emitting array 10 at the predetermined current is $V_3$.

The transferred light emission spectrum of the light-emitting diode can be controlled by changing the physical or chemical arrangement of one layer or more layers in the light-emitting diode. The light-emitting diode can be composed of several materials, such as the series of aluminum gallium indium phosphide (AlGaInP), the series of aluminum gallium indium nitride (AlGaInN), and/or the series of zinc oxide (ZnO). The active layer can be configured to be a single heterostructure (SH), a double heterostructure (DH), a double-side double heterostructure (DDH), or a multi-quantum well (MWQ). Besides, the wavelength of the emitted light could be controlled by changing the number of the pairs of the quantum well.

The material of the substrate(s) used for growing or supporting the light-emitting structure unit(s) can include but does not limit to germanium (Ge), gallium arsenide (GaAs), indium phosphide (InP), sapphire, silicon carbide (SiC), silicon (Si), lithium aluminium oxide ($LiAlO_2$), zinc oxide (ZnO), gallium nitride (GaN), aluminum nitride (AlN), glass, composite, diamond, CVD diamond, diamond-like carbon (DLC) and any combination thereof.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device having an equivalent circuit, comprising:
   at least four terminals, numbered from first terminal to fourth terminal, for electrical power feeding;
   a first light-emitting diode, arranged between the first terminal and the second terminal, is configured to not emit light when a voltage is applied between the second terminal and one of the third terminal and fourth terminal and configured to emit light when a voltage is applied between the first terminal and one of the third terminal and the fourth terminal; and
   a second light-emitting diode, electrically connected to the first light-emitting diode in series, arranged between the third terminal and the fourth terminal, and configured to not emit light when the voltage is applied between the third terminal and one of the first terminal or the second terminal and configured to emit light when a voltage is applied between the fourth terminal and one of the first terminal and the second terminal.

2. The light-emitting device of claim 1, wherein the first terminal and the second terminal are physically arranged on the first light-emitting diode.

3. The light-emitting device of claim 1, wherein the first terminal and the fourth terminal physically have different elevations.

4. The light-emitting device of claim 1, wherein the third terminal and the fourth terminal are physically arranged on the second light-emitting diode.

5. The light-emitting device of claim 1, wherein the first light-emitting diode comprises:
   a first semiconductor layer, on which the first terminal is formed, having a first top surface with a first area; and
   a second semiconductor layer having a portion not covered by the first semiconductor layer.

6. The light-emitting device of claim 5, further comprising a third light-emitting diode, arranged between the first light-emitting diode and the second light-emitting diode, having a second top surface with a second area larger than the first area.

7. The light-emitting device of claim 1, further comprising an electrical connection structure having a width, a first end electrically connected to the second terminal, and a second end.

8. The light-emitting device of claim 7, wherein the first terminal has a physical width greater than the width.

9. The light-emitting device of claim 7, wherein the electrical connection structure comprises one or more bend portions.

10. The light-emitting device of claim 7, wherein a portion of the electrical connection structure attached to the second terminal has an elevation lower than that of the second terminal.

11. The light-emitting device of claim 7, wherein the electrical connection structure is not physically connected to the first terminal.

12. The light-emitting device of claim 7, wherein the third terminal physically has an upper surface electrically connected to and not covered by the electrical connection structure.

13. The light-emitting device of claim 7, wherein the fourth terminal is not physically connected to the electrical connection structure.

14. A light-emitting device having an equivalent circuit, comprising:
   at least four terminals, for electric power feeding, comprising
      a first terminal,
      a second terminal,
      a third terminal, and
      a fourth terminal;
   a first light-emitting diode, arranged between the first terminal and the second terminal, configured to not emit light when a voltage is applied between the second terminal and one of the third terminal or the fourth terminal and configured to emit light when a voltage is applied between the first terminal and one of the third terminal and the fourth terminal; and
   a second light-emitting diode, electrically connected to the first light-emitting diode in series and arranged between the third terminal and the fourth terminal.

15. The light-emitting device of claim 14, wherein the first terminal and the second terminal are physically arranged on the first light-emitting diode.

16. The light-emitting device of claim 14, wherein the third terminal and the fourth terminal are physically arranged on the second light-emitting diode.

17. The light-emitting device of claim 14, further comprising a third light-emitting diode arranged between the first light-emitting diode and the second light-emitting diode, and having a first top surface with a first area, wherein the first light-emitting diode has a second top surface with a second area smaller than the first area.

18. The light-emitting device of claim 14, further comprising an electrical connection structure having a first end electrically connected to the second terminal, and a second end.

19. The light-emitting device of claim 14, further comprising a third light-emitting diode, wherein the first terminal is physically arranged on the first light-emitting diode and the second terminal is physically arranged on the third light-emitting diode.

20. The light-emitting device of claim 14, further comprising a third light-emitting diode, wherein the third terminal is physically arranged on the second light-emitting diode and the fourth terminal is physically arranged on the third light-emitting diode.

\* \* \* \* \*